US012642011B2

(12) United States Patent　　　(10) Patent No.: US 12,642,011 B2
Lahabi et al.　　　　　　　　　　 (45) Date of Patent: May 26, 2026

(54) JUNCTION, DEVICE AND METHODS OF FABRICATION

(71) Applicant: UNIVERSITEIT LEIDEN, EZ Leiden (NL)

(72) Inventors: Kaveh Lahabi, Leiden (NL); Thomas Mechielsen, Leiden (NL); Marcel B. S. Hesselberth, Leiden (NL); Tycho J. Blom, Leiden (NL); Jan Aarts, Leiden (NL)

(73) Assignee: UNIVERSITEIT LEIDEN, Leiden (NL)

( * ) Notice: Subject to any disclaimer, the term of this patent is extended or adjusted under 35 U.S.C. 154(b) by 913 days.

(21) Appl. No.: 17/914,411

(22) PCT Filed: Mar. 24, 2021

(86) PCT No.: PCT/EP2021/057627
§ 371 (c)(1),
(2) Date: Sep. 26, 2022

(87) PCT Pub. No.: WO2021/191306
PCT Pub. Date: Sep. 30, 2021

(65) Prior Publication Data
US 2023/0103370 A1　　Apr. 6, 2023

(30) Foreign Application Priority Data
Mar. 26, 2020　(GB) ...................................... 2004372

(51) Int. Cl.
*H10N 60/12*　　(2023.01)
*H10N 60/01*　　(2023.01)
*H10N 60/80*　　(2023.01)

(52) U.S. Cl.
CPC ......... *H10N 60/12* (2023.02); *H10N 60/0912* (2023.02); *H10N 60/805* (2023.02)

(58) Field of Classification Search
CPC ...................................................... H10N 60/12
See application file for complete search history.

(56) References Cited

U.S. PATENT DOCUMENTS 4,358,783 A * 11/1982 Hebard .................. H10N 60/85
　　　　　　　　　　　　　　　　　　　　 427/63
5,422,337 A 　 6/1995 Tanaka et al.
(Continued)

FOREIGN PATENT DOCUMENTS

| CN | 108198935 | 6/2018 |
| EP | 0572324 | 12/1993 |
| JP | 2016149467 | 8/2016 |

OTHER PUBLICATIONS

Winhold et al. "Superconductivity and metallic behavior in PbxCyO[delta] structures prepared by focused electron beam induced deposition". Applied Physics Letters 105, 162603. Full. (Year: 2014).*

(Continued)

*Primary Examiner* — Paul A Wartalowicz
(74) *Attorney, Agent, or Firm* — Terry M. Sanks, Esq.; Beusse Sanks, PLLC

(57) ABSTRACT

A Josephson junction comprises superconducting electrodes (20) interconnected via an intermediate Josephson barrier (22), wherein the superconducting electrodes (20) and the intermediate Josephson barrier (22) are made out of the same chemical elements and are in a pristine condition.

20 Claims, 11 Drawing Sheets

(56) References Cited

U.S. PATENT DOCUMENTS

| | | | |
|---|---|---|---|
| 5,618,446 A | 4/1997 | Nagaishi | |
| 2017/0133577 A1 | 5/2017 | Cybart et al. | |
| 2019/0109000 A1* | 4/2019 | Martin | .............. H01L 21/02529 |

OTHER PUBLICATIONS

S. Sengupta et al, "Superconducting nanowires by electron-beam-induced deposition," Appl. Phys. Lett. 106, 042601 (2015), DOI: 10.1063/1.4906269.

F. Chiodi et al, "Geometry-related magnetic interference patterns in long SNS Josephson junctions," Phys. Rev. B 86, 064510—(2012), DOI: 10.1103/PhysRevB.86.064510.

M.J. Martinez-Perez et al, "NanoSQUID magnetometry of individual cobalt nanoparticles grown by focused electron peam induced deposition," Superconductor Science and Technology, vol. 30 (2017), p. 024003, DOI: 10.1088/0953-2048/30/2/024003.

B.B. Lewis et al, "3D Nanoprinting via laser-assisted electron beam induced deposition: growth kinetics, enhanced purity, and electrical resistivity," Beilstein J Nanotechnol, (2017), 8:801-812. DOI: 10.3762/bjnano.8.83.

F. Porrati et al, "Crystalline Niobium Carbide Superconducting Nanowires Prepared by Focused Ion Beam Direct Writing," ACS Nano (2019), 13, 6, 6287-6296 DOI: 10.1021/acsnano.9b00059.

Winhold, M. et al: "Superconductivity and metallic behavior in PbxCy0[delta] structures prepared by focused electron beam induced deposition" Applied Physics Letters, A I P Publishing LLC, US, vol. 105, No. 16, Oct. 20, 2014 (Oct. 20, 2014), XPO1219111, ISSN: 0003-6951, DOI: 10.1063/1.4898819. Retrieved by https://aip. scitation. org/doi/10.1063/1.4898819.

International Search Report, Jun. 22, 2021.

Blom et al., "Direct-Write Printing of Josephson Junctions in a Scanning Electron Microscope," ACSNANO, https://dx.doi.org/10.1021/acsnano.0c03656?ref=pdf, accessed Nov. 23, 2020.

* cited by examiner

JUNCTION, DEVICE AND METHODS OF FABRICATION

The invention relates to a Josephson junction, a method of fabricating a Josephson junction, a superconducting device or electronic circuit comprising a Josephson junction and a method of fabricating a superconducting device or electronic circuit comprising a Josephson junction.

The Josephson effect arises when macroscopic quantum states are separated by a medium that allows their wavefunctions to partially overlap. The phenomenon is realised in Josephson junctions in which the macroscopic wavefunctions of superconducting electrodes are coupled via some form of barrier. Charge transport in a Josephson junction is governed by the difference in the quantum mechanical phases of the superconducting electrodes i.e. the so-called current-phase relation. Josephson junctions are used in superconducting electronics, with applications in a multitude of fields including detectors for imaging and signal processing, low-dissipation logic circuits and quantum computing.

According to a first aspect of the invention, there is provided a Josephson junction comprising superconducting electrodes interconnected via an intermediate Josephson barrier, wherein the superconducting electrodes and the intermediate Josephson barrier are made out of the same chemical elements and are in a pristine condition.

An intermediate Josephson barrier (also commonly known as an intermediate Josephson weak link) is defined as an intermediate medium that couples (at least) two superconducting wavefunctions together and yields a single-valued current-phase relation or, alternatively, an intermediate medium that couples (at least) two superconductors together and results in electrical transport characteristics which abide by the first and second Josephson relations.

The superconducting electrodes and the intermediate Josephson barrier made out of the same chemical elements means that the superconducting electrodes and the intermediate Josephson barrier consist of the same chemical elements. The superconducting electrodes and the intermediate Josephson barrier being in a pristine condition means that the superconducting electrodes and the intermediate Josephson barrier are in their original unaltered condition. In other words, the pristine superconducting electrodes and intermediate Josephson barrier are in the same, or substantially the same, condition as when they were originally formed, and they are not subjected to any post-processing that would have altered or damaged their condition following their formation.

Having the superconducting electrodes and the intermediate Josephson barrier made out of the same chemical elements and in a pristine condition not only results in a Josephson junction with electrical transport properties that can be reliably controlled to achieve a desired and consistent electrical behaviour, particularly across multiple Josephson junctions, but also minimises the number of processing steps required to fabricate the Josephson junction. Indeed, it is envisaged that a Josephson junction in accordance with the invention may be fabricated in a single processing step.

In contrast to the invention, some conventional Josephson junctions take the form of heterogeneous structures in which the superconducting electrodes and the intermediate Josephson barrier are respectively made out of at least two distinct materials, that is to say the material of the superconducting electrodes differs by at least one chemical element from the material of the intermediate Josephson barrier. For the conventional heterogeneous Josephson junctions, the difference in materials is deliberately used to distinguish electrical transport properties of the intermediate Josephson barrier from electrical transport properties of the superconducting electrodes. The requirement for at least two distinct materials in the conventional heterogeneous Josephson junction necessitates an increased number of processing steps to fabricate the conventional heterogeneous Josephson junction, which in turn results in longer fabrication times, a higher risk of inconsistent electrical behaviour across multiple heterogeneous Josephson junctions and a higher risk of cross-contamination arising from the use of resist patterns and a high number of lithographic processing steps.

In embodiments of the invention, one or more local material characteristics of the superconducting electrodes may be different from one or more local material characteristics of the intermediate Josephson barrier. For example, the one or more local material characteristics may include at least one of, but are not limited to: a ratio between chemical element constituents; morphology; and lattice order. Such variation in local material characteristics result in a difference in electrical transport properties between the superconducting electrodes and the intermediate Josephson barrier to provide a functional Josephson junction.

In further embodiments of the invention, the superconducting electrodes and the intermediate Josephson barrier may be made out of the same alloy (e.g. tungsten carbide). The alloy may include at least one metal chemical element and at least one non-metal chemical element.

In still further embodiments of the invention, the Josephson junction may have a substrate-conformal morphology and/or at least one of the superconducting electrodes and/or the intermediate Josephson barrier may be non-planar. Having the superconducting electrodes and the intermediate Josephson barrier made out of the same chemical elements readily allows at least one of the superconducting electrodes and/or the intermediate Josephson barrier of the Josephson junction of the invention to follow a non-planar shape of a support substrate, surface or electrical circuit, thus increasing the range of products and applications to which the Josephson junction may be applied.

Optionally at least one of a width and a thickness of the intermediate Josephson barrier may be larger (e.g. one or more orders of magnitude larger) than a temperature-dependent superconducting coherence length of the superconducting electrodes.

By having the width and/or the thickness of the intermediate Josephson barrier exceeding the temperature-dependent superconducting coherence length of the superconducting electrodes (preferably by one or more orders of magnitude), the fabrication of the Josephson junction becomes less complex and therefore more reliable. This is useful when it comes to manufacturing large numbers of Josephson junctions and/or adding a Josephson junction to an existing circuit/device for interfacing, augmentation or repair purposes, particularly when the Josephson junction is for a mechanically fragile structure or a chemically sensitive surface. The mechanically fragile structure or chemically sensitive surface may comprise of one or more components or elements that would be damaged if subjected to spin coating or any lithographic processes that involve wet processing, e.g. immersion and/or washing in a liquid.

In contrast to the invention, some conventional Josephson junctions take the form of homogeneous structures in which the superconducting electrodes and the intermediate Josephson barrier are made out of a single superconducting material (i.e. the superconducting electrodes and the intermediate Josephson barrier are identical in chemical composition, lattice order and morphology) and are subjected to post-processing that results in the superconducting electrodes and the intermediate Josephson barrier not being in pristine condition. In conventional constriction-type Josephson junctions, the weak link is in the form of a constriction that is required to be smaller in size than the superconducting electrodes. The constriction defines a geometrical confinement that creates a local suppression of the superconducting wavefunctions at the intermediate Josephson barrier. In order for such conventional constriction-type Josephson junctions to function properly, a width and a thickness of the constriction are required to be smaller than the temperature-dependent superconducting coherence length of the superconducting electrodes.

Alternatively, in embodiments of the invention, at least one of a width and a thickness of the intermediate Josephson barrier may be smaller than a temperature-dependent superconducting coherence length of the superconducting electrodes. This may be used to provide desired electrical transport properties of the Josephson junction.

Further optionally a width and/or a thickness of the intermediate Josephson barrier may be the same as, substantially the same as or larger than a width and/or a thickness of the superconducting electrodes.

Alternatively, a width and/or a thickness of the intermediate Josephson barrier may be in the range of 5% to 5000% of a width and/or a thickness of the superconducting electrodes.

It will be understood that the width or thickness of the intermediate Josephson barrier is measured along any axis that is perpendicular to a direction of electrical transport between the superconducting electrodes, e.g. an axis perpendicular to a dimension of the intermediate Josephson barrier that separates the superconducting electrodes, and the width or thickness of the superconducting electrodes is measured along the same axis or a parallel axis.

Unlike conventional constriction-type Josephson junctions, it is not essential for the Josephson junction of the invention to have a significant geometrical constriction or tapering of the width and thickness of the intermediate Josephson barrier relative to the superconducting coherence length of the superconducting electrodes in order to provide a functional Josephson junction. The intermediate Josephson barrier of the invention has a width and/or a thickness that preferably far exceeds, by one or more orders of magnitude, the superconducting coherence length of the superconducting electrodes.

On the contrary, conventional constriction-type Josephson junctions require the dimensions of the intermediate Josephson barrier to be substantially smaller than the dimensions of the superconducting electrodes. More precisely, in conventional constriction-type Josephson junctions, the width and thickness of the intermediate Josephson barrier need to be smaller than the superconducting coherence length of the superconducting electrodes, which is typically no more than a few nanometres (e.g. around 6 nm for tungsten carbide). This has disadvantages in terms of increases in processing steps and fabrication difficulty and reductions in fabrication yield, reliability and repeatability.

According to a second aspect of the invention, there is provided a method of fabricating a Josephson junction, the Josephson junction comprising superconducting electrodes interconnected via an intermediate Josephson barrier, the method comprising the step of scanning an electron beam in the presence of a precursor in an electron beam induced deposition (EBID) process to directly write the Josephson junction, wherein the superconducting electrodes and the intermediate Josephson barrier are made out of the same chemical elements that is deposited from the precursor.

The features and advantages of the first aspect of the invention and its embodiments apply mutatis mutandis to the features and advantages of the method of the second aspect of the invention and its embodiments.

The method of the invention is a non-destructive direct-write method for fabricating a Josephson junction that relies on an additive technique based on focused EBID. EBID involves the use of a precursor, usually in the form of a gas, and a scanning electron beam that can locally dissociate molecules of the precursor to deposit a material onto a target surface.

The method of the invention provides a robust fabrication technique that permits preparation of the Josephson junction in a single fabrication equipment or tool equipped with an electron beam system and a precursor source, such as a scanning electron microscope (SEM). Furthermore, the EBID process provides the means to print a Josephson junction at a target location on an existing structure or integrate a Josephson junction into a pre-existing device, in particular mechanically or chemically fragile structures and devices that are sensitive or vulnerable to processing, and also provides the means to fabricate multiple Josephson junctions on the same structure or device.

Depositing both the superconducting electrodes and the intermediate Josephson barrier from the same precursor facilitates the complete fabrication of the Josephson junction with the superconducting electrodes and the intermediate Josephson barrier in pristine condition, thus removing the need for post-processing (such as additional thin-film deposition, lift-off, annealing, dry etching, chemical etching, oxidation and ion beam etching or implantation). This in turn beneficially reduces the number of processing steps required to fabricate the Josephson junction to not only shorten the fabrication time, e.g. down to a few minutes, but also reduce the risks of inconsistent electrical behaviour across multiple Josephson junctions and risk of cross-contamination from using resist patterns and a high number of lithographic processing steps.

On the contrary, fabrication of conventional heterogeneous Josephson junctions involves a resource-intensive and multi-step fabrication process. This is typically a combination of thin-film deposition and further structuring/patterning step(s), which can involve lithographic processes (such as spin-coating of resist, chemical/ion etching and lift-off), oxidation or focused ion beam (FIB) milling/implantation. These procedures are not always compatible with the potential applications of superconducting devices, for instance in cases where a fragile or non-planar structure cannot be resist-coated or where lithographic processes or ion bombardment (such as by an ion beam) would have a detrimental impact on the superconducting device.

In embodiments of the invention, the method may include the step of controlling one or more EBID parameters, preferably the electron beam scanning parameters, to tune one or more electrical transport properties of the superconducting electrodes and the intermediate Josephson barrier. The one or more electrical transport properties of the superconducting electrodes and the intermediate Josephson barrier may include at least one of, but are not limited to: superconducting transition temperature; electrical conductivity; and critical current.

The inventors have found that the principle of using the EBID process to fabricate a Josephson junction using a single precursor provides excellent and reliable control over the design of electrical transport properties of the superconducting electrodes and the intermediate Josephson barrier. This is because the EBID parameters can be readily controlled to fine-tune the electrical transport properties of the deposited material of the superconducting electrodes and the intermediate Josephson barrier in order to obtain a desired and consistent electrical behaviour of the Josephson junction.

In further embodiments of the invention, the one or more EBID parameters may include at least one of, but are not limited to: scanning speed; scanning step size;

dwell time; scanning overlap, beam energy; beam voltage; beam current; beam current density; and beam focus.

In still further embodiments of the invention, the step of controlling one or more EBID parameters to tune one or more electrical transport properties of the superconducting electrodes and the intermediate Josephson barrier may include controlling the one or more EBID parameters to vary one or more local material characteristics of the superconducting electrodes and the intermediate Josephson barrier. In such embodiments, the one or more local material characteristics may include at least one of, but are not limited to: a ratio between chemical element constituents; morphology; and lattice order.

The use of different EBID parameters gives rise to local variations in material characteristics that can be used to design the superconducting electrodes and the intermediate Josephson barrier to possess different electrical transport properties.

In the method of the invention, the superconducting electrodes and the intermediate Josephson barrier may be made out of the same alloy (e.g. tungsten carbide), optionally wherein the alloy may include at least one metal chemical element and at least one non-metal chemical element.

In the method of the invention, the Josephson junction may have a substrate-conformal morphology. The method of the invention may include the step of directly writing the Josephson junction onto a non-planar surface so that at least one of the superconducting electrodes and/or the intermediate Josephson barrier is non-planar.

The direct-write attribute of the EBID process is conducive to the direct fabrication of the Josephson junction on a non-planar supporting substrate, surface or electrical circuit.

Optionally the step of scanning an electron beam in the presence of a precursor in an EBID process to directly write the Josephson junction may include the step of forming at least one of a width and a thickness of the intermediate Josephson barrier to be larger than a temperature-dependent superconducting coherence length of the superconducting electrodes.

By having the width and/or the thickness of the intermediate Josephson barrier exceeding the temperature-dependent superconducting coherence length of the superconducting electrodes (preferably by one or more orders of magnitude), the fabrication of the Josephson junction becomes less complex and therefore more reliable. This is useful when it comes to manufacturing large numbers of Josephson junctions and/or adding a Josephson junction to an existing circuit/device for interfacing, augmentation or repair purposes, particularly when the Josephson junction is for a mechanically fragile structure or a chemically sensitive surface.

Alternatively the step of scanning an electron beam in the presence of a precursor in an EBID process to directly write the Josephson junction may include the step of forming at least one of a width and a thickness of the intermediate Josephson barrier to be smaller than a temperature-dependent superconducting coherence length of the superconducting electrodes.

Further optionally the step of scanning an electron beam in the presence of a precursor in an EBID process to directly write the Josephson junction may include the step of forming a width and/or a thickness of the intermediate Josephson barrier to be the same as, substantially the same as or larger than a width and/or a thickness of the superconducting electrodes.

Alternatively the step of scanning an electron beam in the presence of a precursor in an EBID process to directly write the Josephson junction may include the step of forming a width and/or a thickness of the intermediate Josephson barrier to be in the range of 5% to 5000% of a width and/or thickness of the superconducting electrodes.

The method of the invention may include the step of fabricating a Josephson junction on a mechanically fragile substrate or a chemically sensitive surface. This extends the invention to the fabrication of Josephson junctions on mechanically fragile structures and chemically vulnerable surfaces, where conventional Josephson junctions cannot be formed or where their fabrication would have a detrimental impact on the substrate/surface or their surroundings due to conventional processing limitations, such as lithographic processing limitations.

According to a third aspect of the invention, there is provided a Josephson junction obtainable by a method according to any one of the second aspect of the invention and its embodiments.

The features and advantages of the first and second aspects of the invention and their embodiments apply mutatis mutandis to the features and advantages of the Josephson junction of the third aspect of the invention and its embodiments.

According to a fourth aspect of the invention, there is provided a superconducting device or electronic circuit comprising at least one Josephson junction according to any one of the first aspect of the invention and its embodiments.

The features and advantages of the first, second and third aspects of the invention and their embodiments apply mutatis mutandis to the features and advantages of the superconducting device of the fourth aspect of the invention and its embodiments.

Furthermore, having the superconducting electrodes and the intermediate Josephson barrier made out of the same chemical elements and in a pristine condition removes the need for post-processing steps that may otherwise damage or adversely affect the structural integrity, chemical integrity and performance of the superconducting device or electronic circuit.

In embodiments of the invention, the superconducting device or electronic circuit may be a superconducting circuit, a superconducting quantum interference device (SQUID) or a three-dimensional (3D) superconducting structure, such as a 3D superconducting circuit/device or a quantum device/circuit/network.

The fabrication of the Josephson junction to have the superconducting electrodes and the intermediate Josephson barrier made out of the same chemical elements and in a pristine condition is particularly beneficial in the development of 3D superconducting devices and circuits, e.g. 3D magnetometers that can simultaneously measure the magnetic field in all three dimensions.

Optionally the superconducting device or electronic circuit may include a mechanically fragile substrate or a chemically sensitive surface, wherein the Josephson junction may be located on the mechanically fragile substrate or chemically sensitive surface.

According to a fifth aspect of the invention, there is provided a method of fabricating a superconducting device or electronic circuit, the method comprising the step of fabricating at least one Josephson junction of the superconducting device or electronic circuit in accordance with a method according to any one of the second aspect of the invention and its embodiments.

The features and advantages of the first, second, third and fourth aspects of the invention and their embodiments apply mutatis mutandis to the features and advantages of the method of the fifth aspect of the invention and its embodiments.

The method of the invention may include the step of directly writing the Josephson junction to form at least part of a superconducting circuit, a SQUID or a 3D superconducting structure, such as a 3D superconducting circuit/device or a quantum device/circuit/network.

The method of the invention may include the step of directly writing the Josephson junction to interface, repair or augment the superconducting device or electronic circuit. This step can be used to:

interface the superconducting device or electronic circuit with another superconducting device or electronic circuit, such as quantum circuits. Such quantum circuits may utilise superconducting components, e.g. quantum computing circuits that operate using flux qubits;

repair or replace one or more existing components of superconducting devices/circuits;

augment (i.e. adding one or more new components to) superconducting devices and electronic circuits that contain superconducting devices.

According to a sixth aspect of the invention, there is provided a superconducting device or electronic circuit obtainable by a method according to any one of the fifth aspect of the invention and its embodiments.

The features and advantages of the first, second, third, fourth and fifth aspects of the invention and their embodiments apply mutatis mutandis to the features and advantages of the superconducting device of the sixth aspect of the invention and its embodiments.

The invention has many practical applications as a result of not only the fabrication of the Josephson junction to have the superconducting electrodes and the intermediate Josephson barrier made out of the same chemical elements and in a pristine condition but also the direct-write attribute of the EBID process. Exemplary applications of the various aspects of the invention and their embodiments include, but are not limited to:

Writing superconducting circuits and/or devices on systems with a non-planar surface, where conventional resist-based lithography would be difficult or impossible to apply;

Writing superconducting circuits and/or devices on mechanically fragile structures such as membranes, cantilevers and free-standing beams used in micro-electro-mechanical systems (MEMS);

Writing superconducting circuits on systems that are vulnerable to energetic ions or chemical processing (e.g. organic molecules, self-assembled monolayers, Buckminsterfullerene);

Direct-write fabrication of SQUIDs;

3D superconducting circuits and networks;

Quantum computing devices, circuits and/or networks with flux qubits.

The invention also expands the range of products and applications of existing superconducting circuits, devices and sensors. The maskless direct-write attribute of the invention allows these circuits, devices and sensors to be produced at very low cost and in small batches and to be readily modified to meet requirements from a wide range of products and applications. Examples of such products and applications include, but are not limited to:

SQUIDs that can acquire a 2D or 3D magnetic field vector by combining simultaneous or near-simultaneous signals from a plurality of non-coplanar SQUIDs such as magnetometers and gradiometers;

Scanning probe microscopy using a tip or a cantilever to measure the magnetic field (e.g. scanning SQUID microscopes);

Repairing and interfacing superconducting devices and circuits;

Low-dissipation logic circuits;

Production of quantum computing circuits (e.g. flux qubits);

Sensors for medical applications such as magnetoencephalography (MEG) instruments.

Within the scope of this application it is expressly intended that the various aspects, embodiments, examples and alternatives set out in the preceding paragraphs, and the claims and/or the following description and drawings, and in particular the individual features thereof, may be taken independently or in any combination. That is, all embodiments and all features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

Preferred embodiments of the invention will now be described, by way of non-limiting examples, with reference to the accompanying drawings in which.

The figures are not necessarily to scale, and certain features and certain views of the figures may be shown exaggerated in scale or in schematic form in the interests of clarity and conciseness.

An SEM with a focused electron beam and a gas injection system is provided. The gas injection system is configured to selectively inject a precursor gas into the vicinity of a substrate located inside a vacuum chamber of the SEM. Such a configuration of an SEM is well known in the art. A $W(CO)_6$ gas is selected as the precursor gas but it will be appreciated that other suitable precursor gases may be selected. While the superconducting transition temperature $T_c$ of pure crystalline tungsten is only 0.011 K, disordered and amorphous tungsten alloys with Si, C and Ge can reach a $T_c$ of the order of 6 K.

Figure 1:
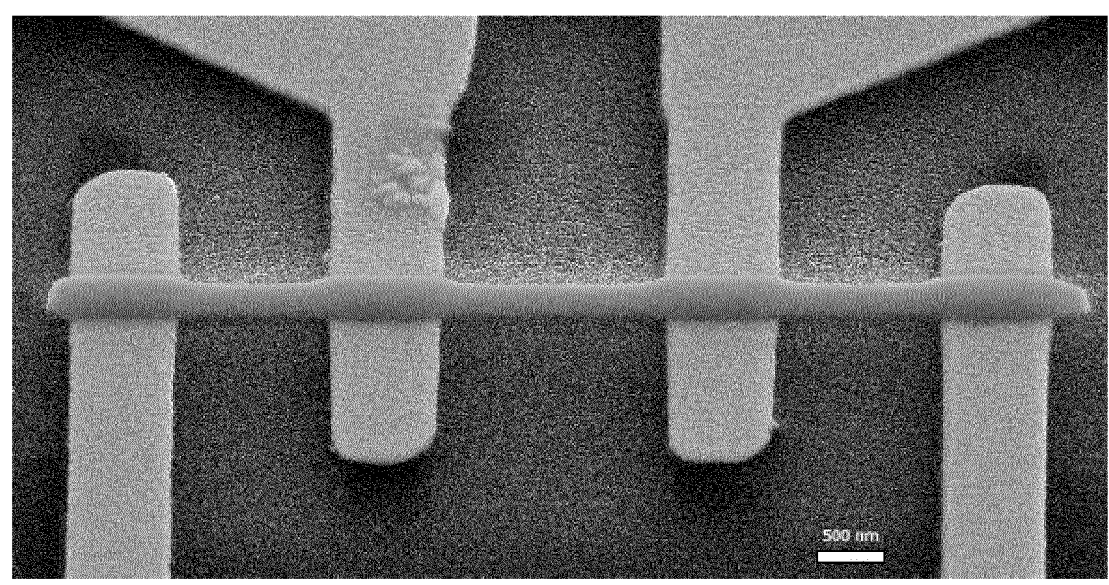
FIG. 1 shows an SEM image of a tungsten carbide wire in contact with four gold electrodes across its length.

A tungsten carbide (WC) wire is direct-written on a $Si_3N_4$-coated silicon substrate with lithographically patterned gold electrodes to facilitate electrical transport measurements, as shown in FIG. 1 that has a scale bar of 500 nm. Each WC wire is written using an EBID process that involves injecting the $W(CO)_6$ precursor gas into the vicinity of the substrate and scanning a 10 KeV electron beam in a straight line to dissociate $W(CO)_6$ precursor molecules to deposit a WC alloy along the straight line. Efficient EBID requires a high local density of electrons to dissociate the organometallic precursor molecules.

Figure 2:
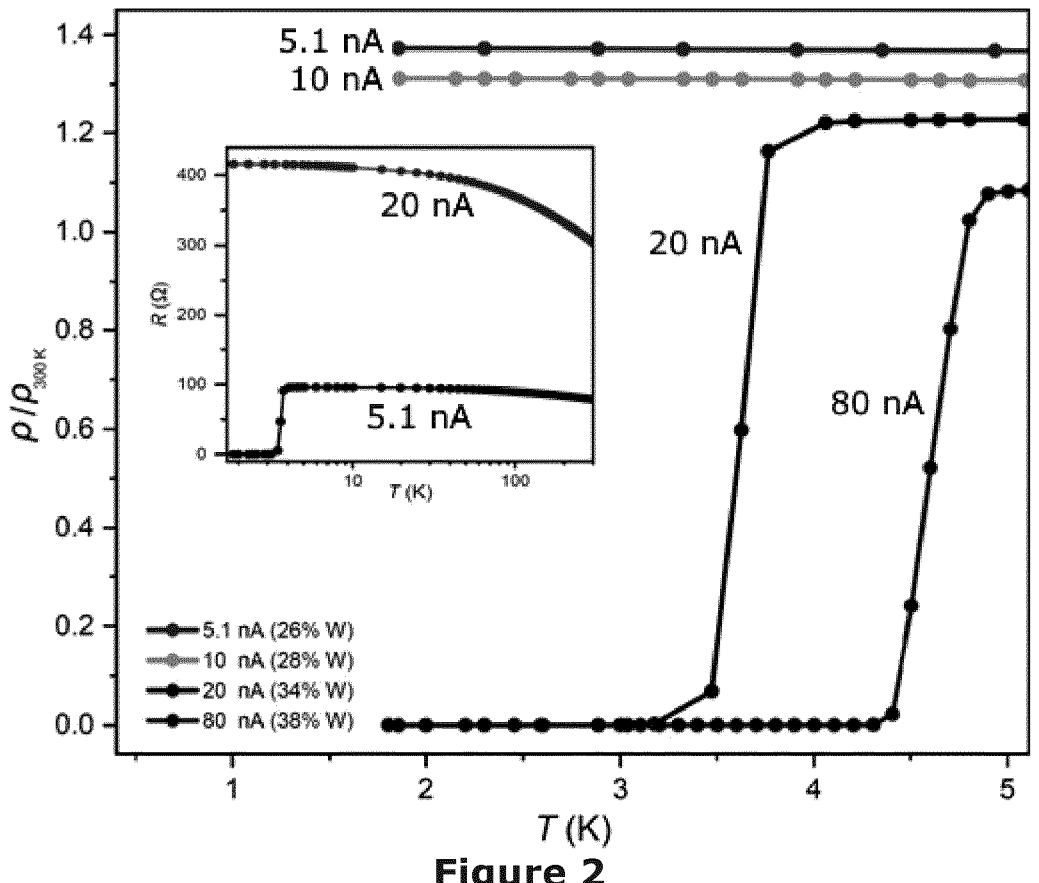
FIG. 2 shows normalised resistivities of tungsten carbide wires deposited at different electron beam currents.

FIG. 2 compares the temperature-dependent resistivities of WC wires deposited using different electron beam currents. The WC wires in FIG. 2 were deposited with a 25 ms dwell time and a 60% scanning overlap. For each electron beam current, the resistance value is normalised by the resistance of the wire at T=300 K. Energy-dispersive X-ray spectroscopy (EDX) was carried out on the deposited WC wires to quantify their metal content (the legend in FIG. 2 shows atomic percentages of W for each electron beam current).

The inventors have found that increasing the electron beam current above 5 nA produces a substantial enhancement of the metal content of the deposited WC wire. As shown in FIG. 2, electron beam currents of 5.1 nA, 10 nA, 20 nA and 80 nA result in respective metal contents of 26%, 28%, 34% and 38% W in terms of atomic percentages of the respective deposited WC wires.

Combining the EDX results with temperature-dependent transport measurements, FIG. 2 reveals a direct correlation between metal content, normalised resistivity, and the occurrence of superconductivity in the WC wires. In particular, the inventors have found that increasing the electron beam current above 5 nA results in an emergence of superconductivity in the WC wires, as exemplarily illustrated in FIG. 2 that shows the superconducting behaviour of the WC wires deposited using 20 nA and 80 nA electron beam currents. The inset of FIG. 2 also shows that the low temperature resistance of the WC wire deposited using a 20 nA electron beam current is 3 to 4 times larger than the one deposited using a 5.1 nA electron beam current.

Increasing the electron beam current therefore results in the direct enhancement of the metal content, electrical conductivity and $T_c$ of the deposited WC by increasing the number of available electrons per precursor molecule. Hence, by varying the EBID parameters to design the electrical transport properties of the deposited WC, the $T_c$ of the deposited WC can be tuned to produce both superconducting and non-superconducting structures. This concept is extended by the inventors to the fabrication of a functional WC Josephson junction by using the EBID process to design different electrical transport properties of the components of the Josephson junction.

The following embodiment of the invention is described with reference to a method of fabricating a Josephson junction from a $W(CO)_6$ precursor in an SEM. It will be appreciated that the following embodiment of the invention is applicable mutatis mutandis to the fabrication of a Josephson junction from other materials that can be deposited using an EBID process and/or using other fabrication equipment or tools that are configured to carry out an EBID process.

Figure 3:
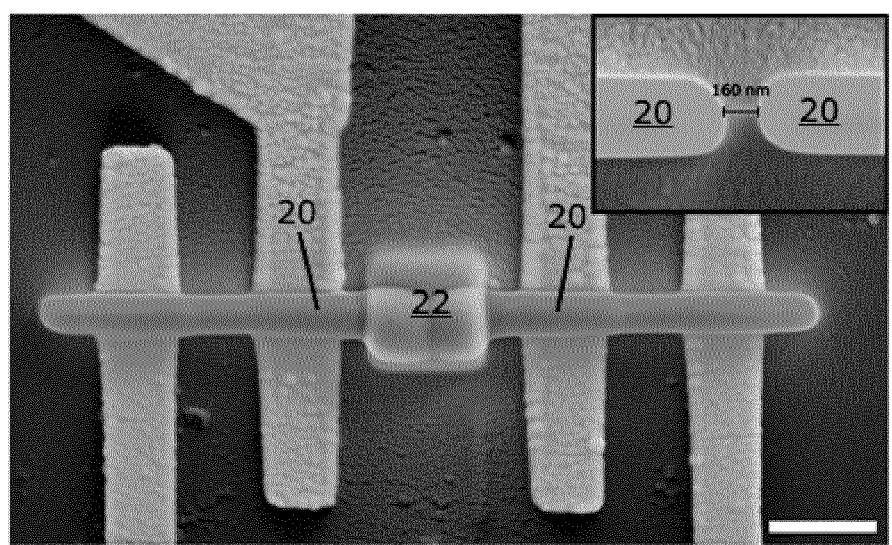
FIG. 3 shows an EBID-formed Josephson junction according to an embodiment of the invention.

A Josephson junction according to an embodiment of the invention is shown in FIG. 3. The scale bar in FIG. 3 corresponds to 1 μm.

The Josephson junction comprises superconducting electrodes 20 interconnected via an intermediate Josephson barrier (referred to hereon as an intermediate Josephson weak link 22). Every part of the Josephson junction is fabricated out of a WC alloy formed by the dissociation of $W(CO)_6$ precursor molecules from the same $W(CO)_6$ precursor using an EBID process. The Josephson junction is prepared by first depositing the superconducting electrodes 20 separated by a gap, which in FIG. 3 is measured at 160 nm. The superconducting electrodes 20 are subsequently connected by depositing the weak link 22, which in FIG. 3 is in the form of a 0.5 μm by 0.5 μm WC square. As a result, the superconducting electrodes 20 and the weak link 22 both consist of the same chemical elements by virtue of being made out of the same WC alloy. Moreover, the superconducting electrodes 20 and the weak link 22 are in a pristine condition due to not being subjected to any post-processing.

Generally, a 20 nA electron beam current having a beam spot diameter of about 60 nm is used to fabricate the Josephson junction. For a 20 nA beam current, the inventors have determined the optimal values for the dwell time to be 25 ms and the scanning step size (pitch) to be about 1 nm. These parameters result in wires with a typical $T_c$ of 4.7 K and a room temperature resistivity $\rho$ of approximately 270 $\mu\Omega$ cm ($\rho(300\ K)/\rho(10\ K) \approx 0.85$).

Figure 4:
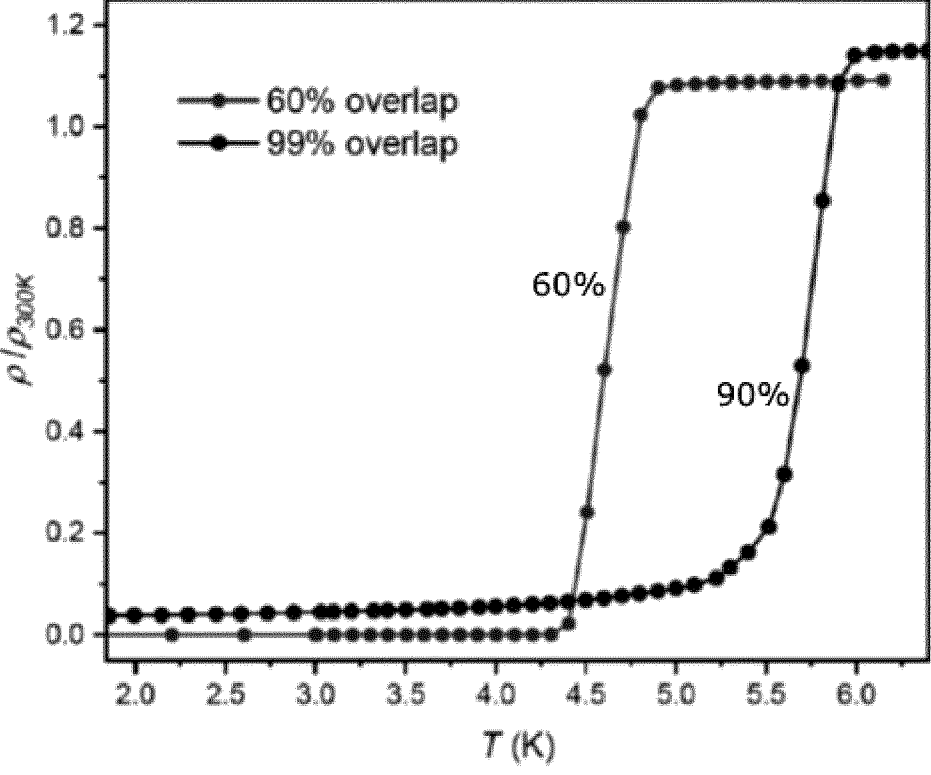
FIG. 4 shows normalised resistivities of tungsten carbide wires deposited with different electron beam scanning overlaps.

Increasing the electron beam current to 80 nA can raise the $T_c$ to as high as 5.7 K. FIG. 4 shows normalised resistivities of WC wires deposited at an 80 nA electron beam current with 60% and 99% scanning overlaps respectively. The WC wire deposited with a 60% scanning overlap has a $T_c$ of around 4.6 K and the WC wire deposited with a 99% scanning overlap has a $T_c$ of around 5.7 K. However, care must be taken in using high beam currents to account for the risk of electrostatic charging and larger beam spots potentially affecting control over device fabrication.

When the superconducting electrodes 20 are not connected by the weak link 22, electrical transport measurements show an insulating behaviour between the superconducting electrodes 20. Moreover, there was no observable electrical contribution from delocalized (halo) deposits that are known to form around EBID structures.

In order to produce a functional Josephson junction, the weak link 22 needs to separate the superconducting condensates of the superconducting electrodes 20 while also allowing the macroscopic wavefunctions of the superconducting electrodes 20 to overlap and yield a single-valued current-phase relation. To create different electrical transport properties between the superconducting electrodes 20 and the weak link 22, the EBID parameters (such as scanning speed, scanning step size, dwell time, scanning overlap, beam energy, beam voltage, beam current, beam current density and beam focus) are controlled to tune one or more electrical transport properties of the superconducting electrodes 20 and the weak link 22, such as $T_c$, electrical conductivity and critical current $I_c$. In particular, the EBID parameters are controlled to vary one or more local material characteristics of the superconducting electrodes 20 to be different from one or more local material characteristics of the weak link 22, such as the respective concentrations of the W and C components, the morphology of the C component and the lattice order of the deposited WC.

As discussed above, the magnitude of the electron beam current influences the electrical transport properties of the deposited WC. Thus, the electron beam current can be varied during the EBID process to deposit both the superconducting electrodes 20 and the weak link 22 from the same $W(CO)_6$ precursor while designing them to have the respective electrical transport properties required to produce a functional Josephson junction.

Figure 5:
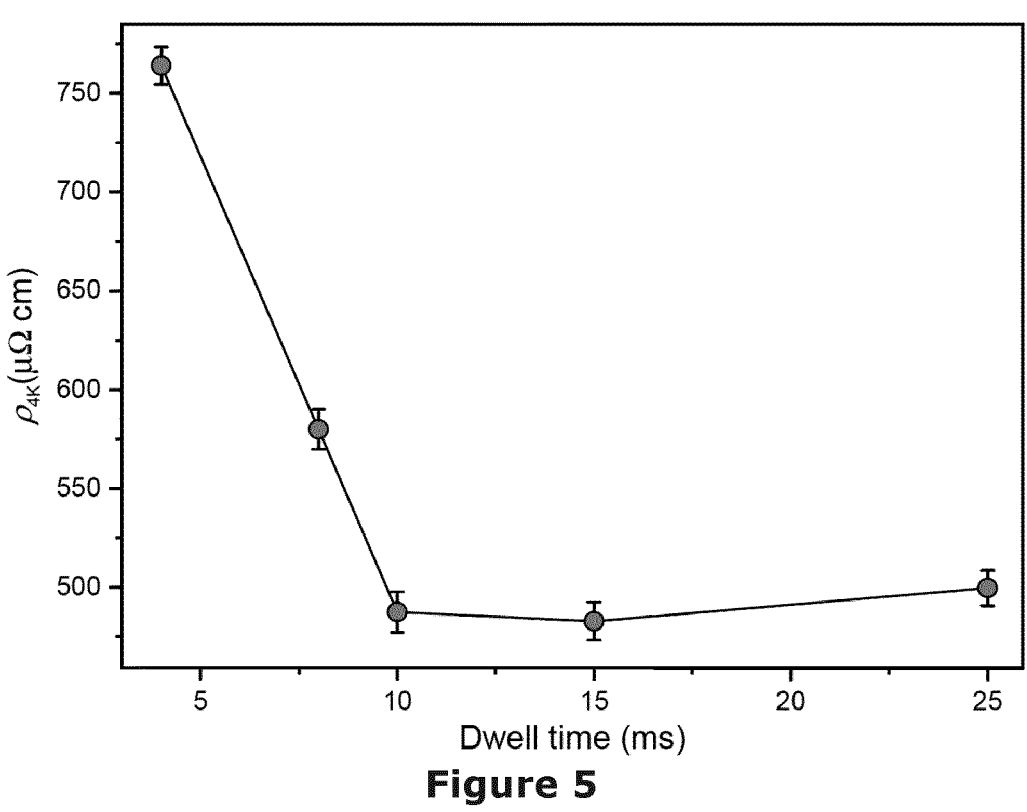
FIG. 5 shows a low temperature electrical resistivity as a function of dwell time for a 200 nm wide WC ribbon deposited at a 20 nA electron beam current and with a 60% scanning overlap.

Another approach to tuning the electrical transport properties of the superconducting electrodes 20 and the weak link 22 would be to control their respective electrical conductivities by controlling the dwell time of the electron beam, i.e. the time the electron beam spends per pixel. Longer dwell times enhance the metallicity of the deposited WC by increasing the number of electron scatterings per $W(CO)_6$ precursor molecule, which leads to a more efficient CO desorption. This is demonstrated in FIG. 5 that shows the low temperature electrical resistivity as a function of dwell time for 200 nm wide WC ribbons deposited at a 20 nA electron beam current and with a 60% scanning overlap. A significant drop in electrical resistivity is observed for dwell times above 10 ms. It follows that dwell time can be implemented as a controllable EBID parameter to vary the electrical conductivity of the weak link 22.

Figure 6:
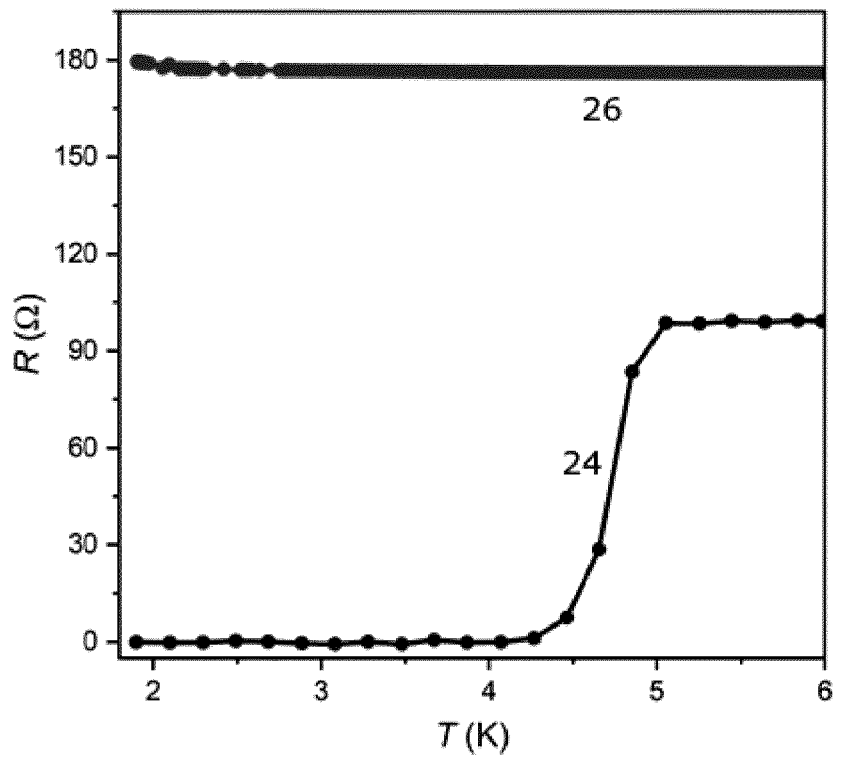
FIG. 6 shows respective resistances of a tungsten carbide wire and a tungsten carbide rectangle as a function of temperature.

FIG. 6 presents respective resistances of a WC wire 24 and a WC rectangle 26 as a function of temperature. The WC wire 24 is deposited with a 20 nA electron beam current, a 25 ms dwell time, a 1 nm step size and a 99% scanning overlap. The WC rectangle 26 is deposited using a 20 nA electron beam current, a 4 ms dwell time, a 23 nm step size and a 60% scanning overlap. The wire 24 and rectangle 26 respectively are for use as the superconducting electrodes 20 and the weak link 22 of the Josephson junction. By changing the dwell time during the EBID process, both the superconducting electrodes 20 and the weak link 22 can be deposited from the same $W(CO)_6$ precursor while having the respective electrical transport properties required to produce a functional Josephson junction.

Three different Josephson junctions JJ1, JJ2, JJ3 were fabricated using the EBID process in accordance with the invention. The Josephson junctions JJ1 and JJ2 are printed on separate substrates on different days using the same EBID parameters including a 4 ms dwell time used for depositing the weak link 22. For the Josephson junction JJ3, the dwell time used for depositing the weak link 22 is increased to 10 ms, thus resulting in the Josephson junction JJ3 having a higher metal content in comparison to the Josephson junctions JJ1, JJ2. It should be mentioned that the Josephson junction JJ1 is deposited on a different substrate in which the distance between the Au electrodes is around three times larger and therefore corresponds to a larger than normal state resistance.

Figure 7:
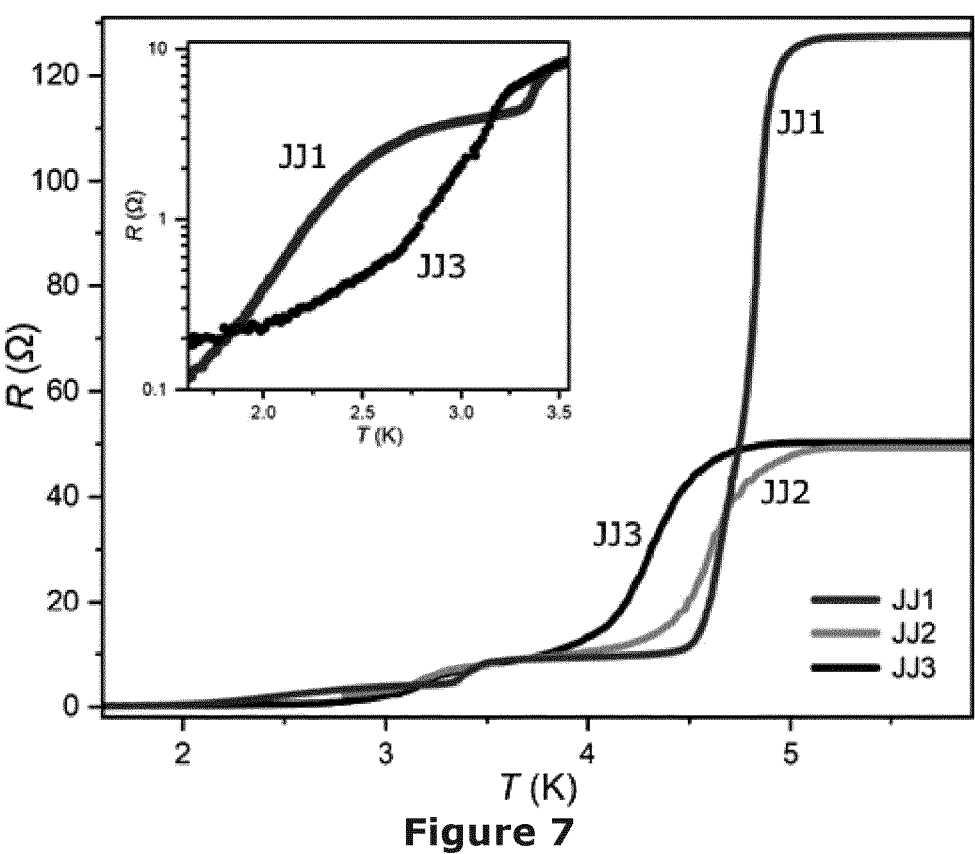
FIGS. 7 to 9 show electrical transport properties of three different Josephson junctions according to embodiments of the invention.

FIG. 7 shows the temperature-dependent resistances R(T) of the different Josephson junctions JJ1, JJ2, JJ3 measured as a function of temperature using a 10 μA current bias. The R(T) of each Josephson junction JJ1, JJ2, JJ3 exhibits two main transitions: one at higher temperatures (typically around 4.5 K) that represents the superconducting transition of the superconducting electrodes 20; and a broader transition at noticeably lower temperatures that correspond to the proximity effect in the weak link 22. Below the transition temperature of the weak link 22, the Josephson junctions JJ1, JJ2, JJ3 develop a distinct critical current $I_c$. The inset shows a close-up of the proximity-induced transition of the weak links 22 for the Josephson junctions JJ1 and JJ3, which occurs below 3K.

Figure 8:
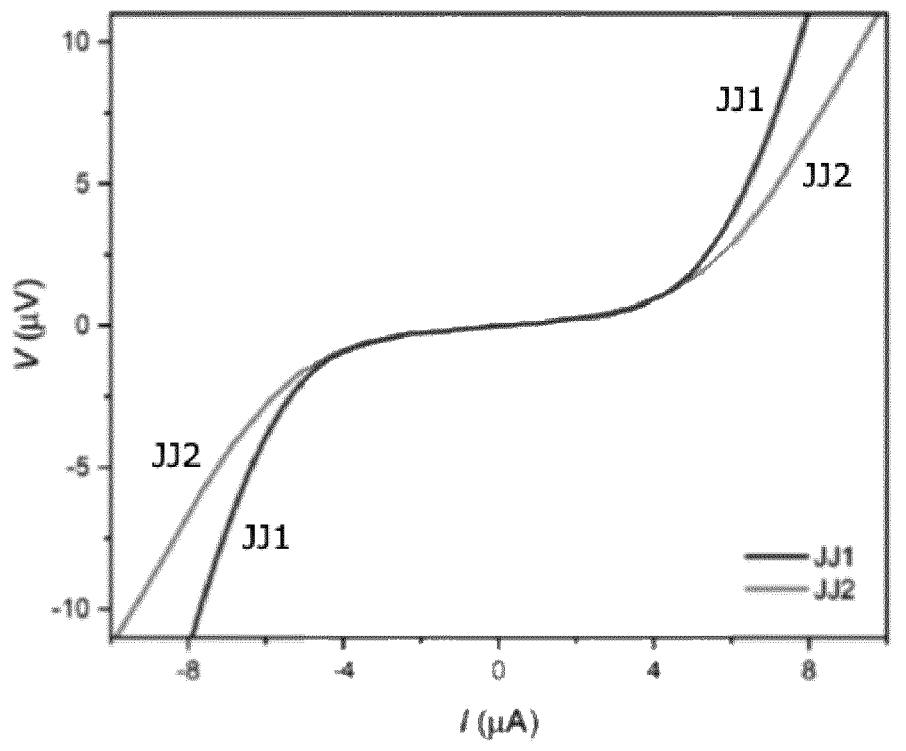
Figure 9:
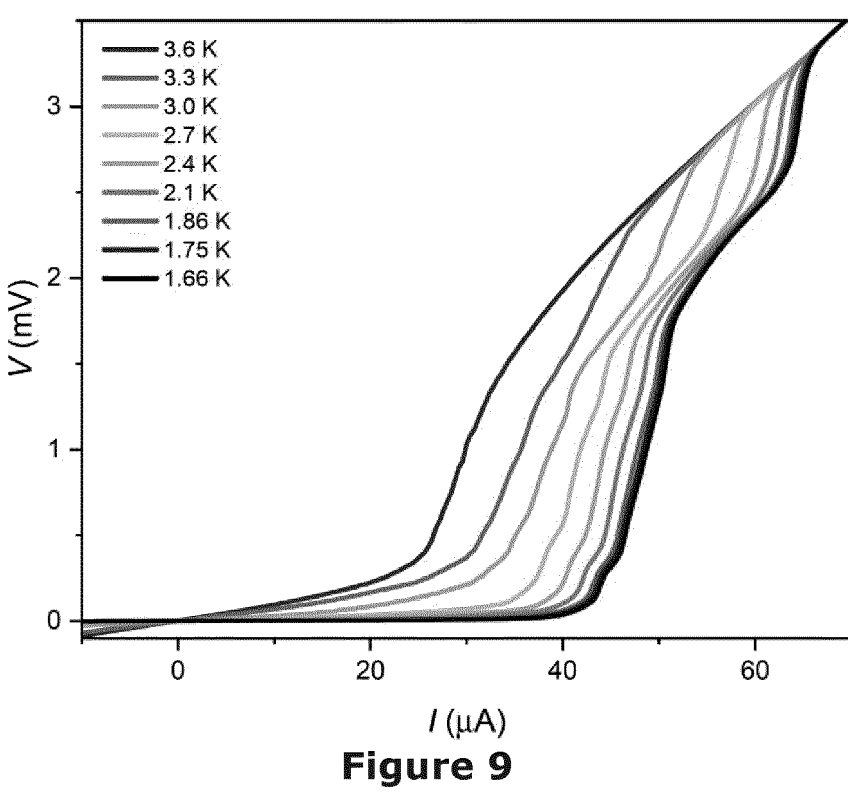

FIG. 8 shows measured current-voltage (I-V) curves of the Josephson junctions JJ1, JJ2 at T=1.5 K. Using the same EBID parameters for the respective weak links 22 yields similar critical currents $I_c$ for both Josephson junctions JJ1, JJ2. FIG. 9 shows a measured I-V curve of the Josephson junction JJ3 at various temperatures. The enhanced metallicity of the weak link 22 of the Josephson junction JJ3 due to the longer dwell time results in the Josephson junction JJ3 having a significantly higher critical current $I_c$ than the Josephson junctions JJ1 and JJ2. It was observed that at T=1.55 K the Josephson junctions JJ1, JJ2, JJ3 can exhibit a small residual resistance that is typically two orders of magnitude smaller than the total resistance of the respective weak links 22.

To unambiguously establish the Josephson transport in the EBID-formed Josephson junctions, their Shapiro responses to a radio frequency (RF) excitation were measured. When external RF radiation couples to the junction dynamics by driving an additional RF supercurrent, it leads to the emergence of Shapiro steps in the I-V characteristics of a Josephson junction. These take the form of discrete voltage steps that appear at $V=nhf/2e=nf\Phi_0$, where f is the microwave frequency, n is an integer and $\Phi_0$ is the superconducting magnetic flux quantum. The Shapiro responses of the EBID-formed Josephson junctions were verified by irradiating the EBID-formed Josephson junctions with microwaves from a nearby antenna while measuring their I-V characteristics using a direct current (DC) bias.

FIGS. 10 to 14 show Shapiro responses measured for the Josephson junctions JJ1, JJ3. For each Josephson junction JJ1, JJ3, the steps occur at exactly integer multiples of $f\Phi_0$.

Figure 10:
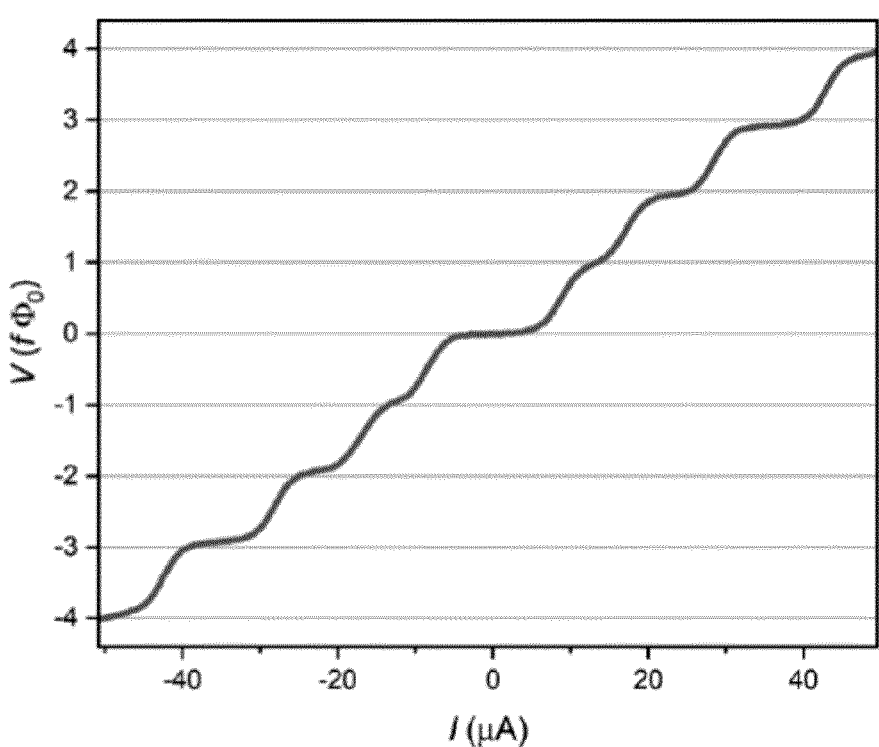
FIGS. 10 to 15 show Shapiro responses measured for different Josephson junctions according to embodiments of the invention.

FIG. 10 shows the presence of Shapiro steps in the I-V curve of the Josephson junction JJ3 under RF irradiation, measured at a frequency f=6.4 GHz at T=1.5 K. At T=1.5 K, the Josephson junction JJ3 has a finite residual resistance of around 0.2Ω. In order to show the $f\Phi_0$ quantization of the steps in FIG. 10, the linear background has been subtracted from the I-V curve and the voltage scale is normalised in units of $f\Phi_0$ where $\Phi_0$ is the superconducting magnetic flux quantum.

Figures 11, 12:
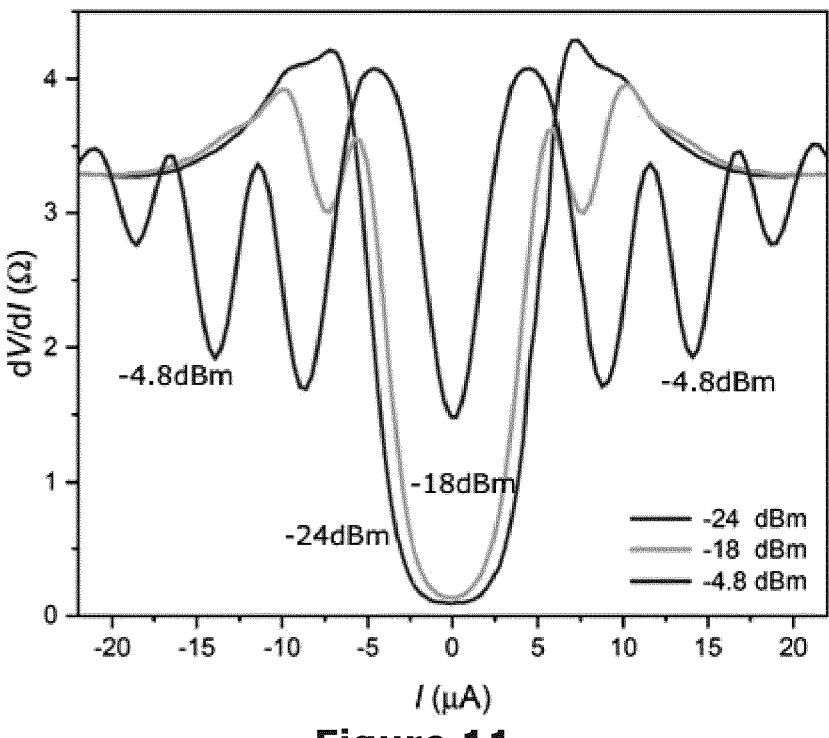

FIG. 11 shows differential resistance (dV/dI) curves that illustrate the Shapiro response of the Josephson junction JJ1 for a range of RF powers, measured at T=1.64 K. The Shapiro steps manifest themselves as peaks in the dV/dI curves and emerge by increasing the RF power.

Figure 13:
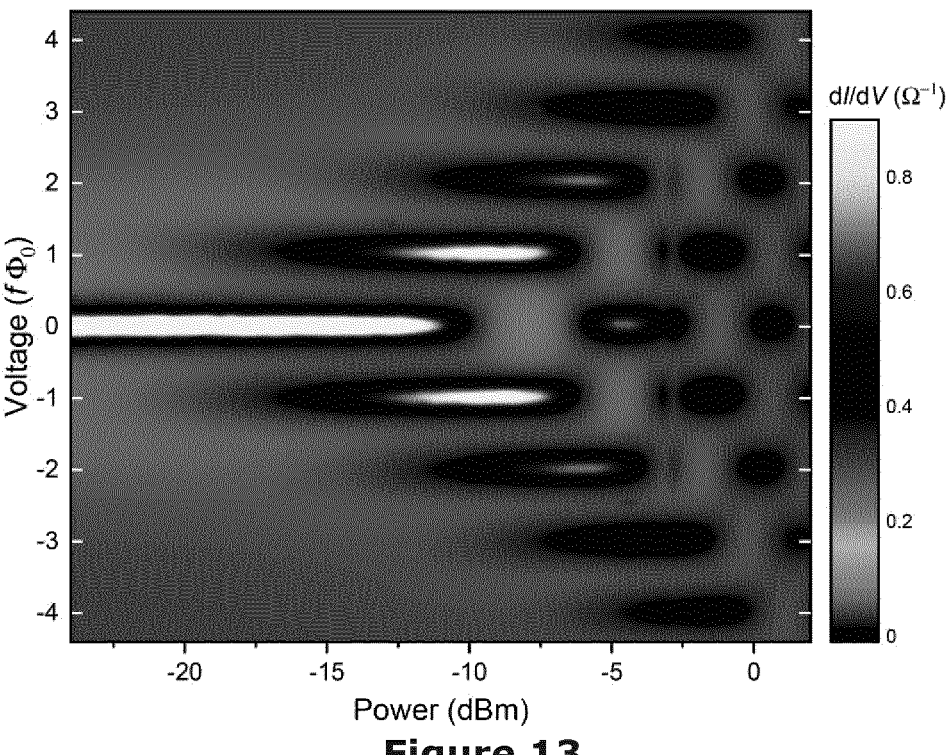

FIGS. 12 and 13 present the evolution of the Shapiro response of the Josephson junction JJ1 with RF power. In FIG. 12, this was carried out by mapping the differential resistance (dV/dI) as a function of RF power and direct current (swept from negative to positive bias), where the vertical white lines correspond to the RF powers for the measurements shown in FIG. 11. FIG. 13 demonstrates the quantization of the Shapiro response by representing the results of FIG. 12 in the form of differential conductance (dI/dV), plotted as a function of RF power and voltage, where the voltage scale is presented in units of $f\Phi_0$.

Figure 14:
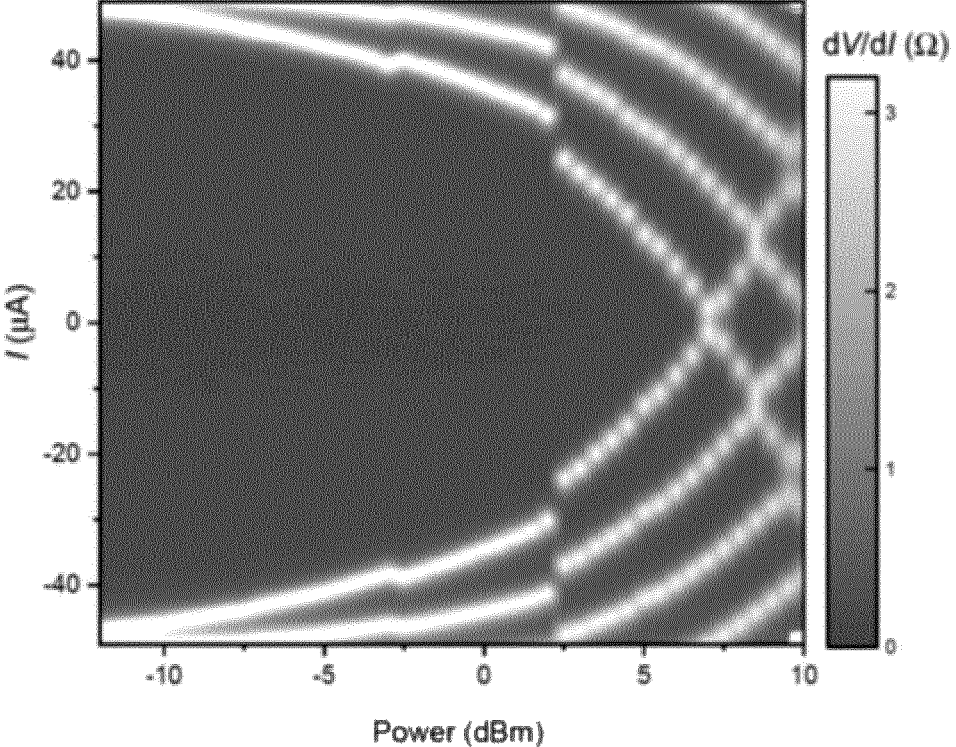
Figure 15:
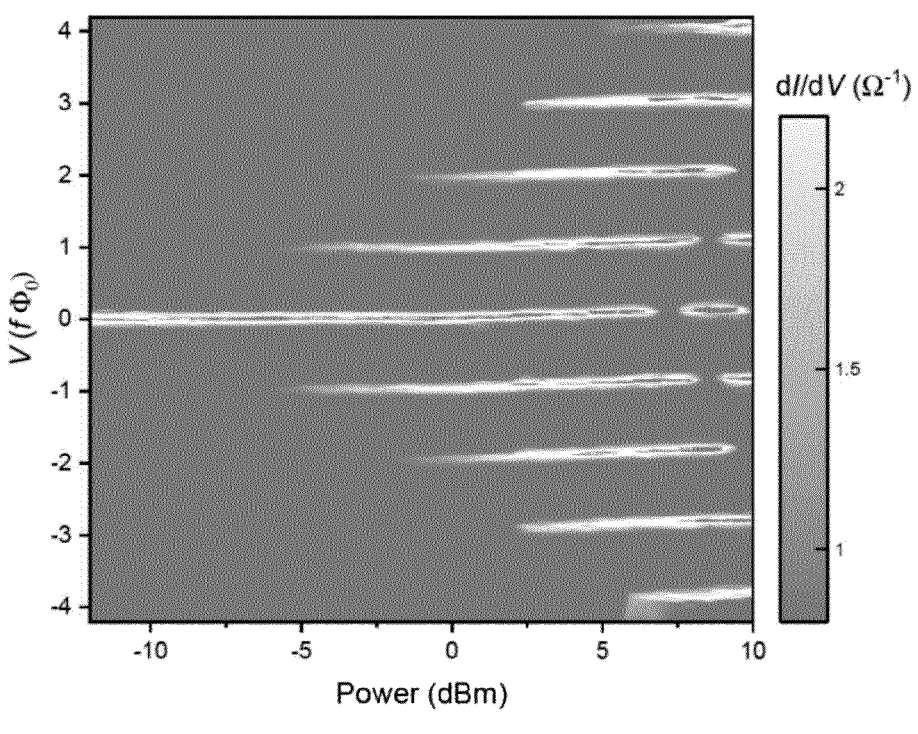

FIGS. 14 and 15 present the evolution of the Shapiro response of the Josephson junction JJ3 with RF power. In FIG. 14, this was carried out by mapping the differential resistance (dV/dI) as a function of RF power and direct current. In FIG. 15, this was carried out by mapping the differential conductance (dI/dV) as a function of RF power and voltage, where the voltage scale is presented in units of $f\Phi_0$ to demonstrate the quantization of the Shapiro response.

In addition to establishing the quantized Shapiro response of the Josephson junctions, magnetic field-dependent measurements are also used to verify the Josephson transport in the Josephson junctions. The field-dependent critical current $I_c(B)$ of a single Josephson junction is often associated with the well-known Fraunhofer diffraction pattern, in which $I_c$ goes to zero when the magnetic flux applied to the junction is an integer multiple of $\Phi_0$. However, depending on their exact shape, dimensions and material characteristics, Josephson junctions can yield different $I_c(B)$ patterns. For long and narrow diffusive Josephson junctions, where the length and width of the weak link 22 are comparable to each other and are also smaller than the penetration depth $(\lambda=1.05\times10^{-3} \sqrt{\rho_N/T_c}\approx830$ nm), $I_c(B)$ follows a Gaussian-like decay, given by Equation 1:

$$I_c(B) = I_c(0)\left|e^{-\left(\frac{BS}{\Phi_0}\right)^2/(2\sigma^2)}\right| \qquad (1)$$

Where $I_c(0)$ is the zero field critical current, s is the effective area of the weak link 22 (in this case $6\times10^{-14}$ m$^2$) and the Gaussian coefficient ci is determined by the diffusive trajectories of Andreev pairs. The value of ci varies according to the exact geometry of the Josephson junction.

Figure 16:
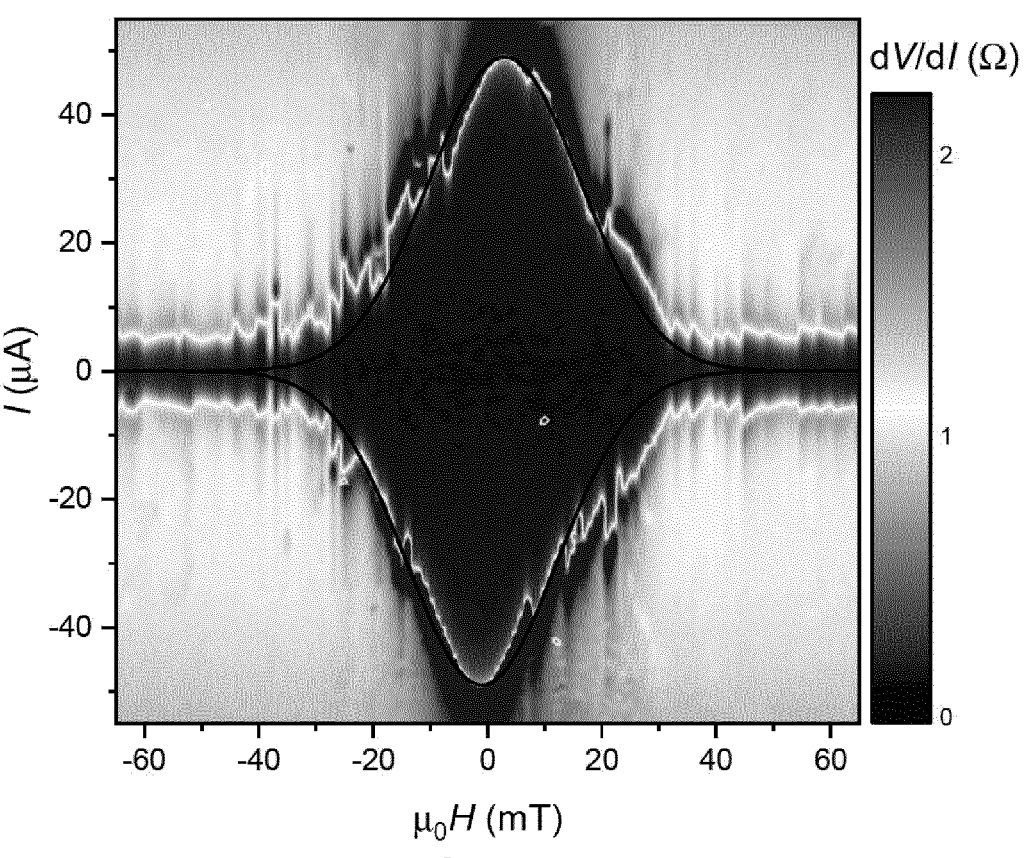
FIGS. 16 and 17 show field-dependent measurements of different Josephson junctions according to embodiments of the invention.
Figure 17:
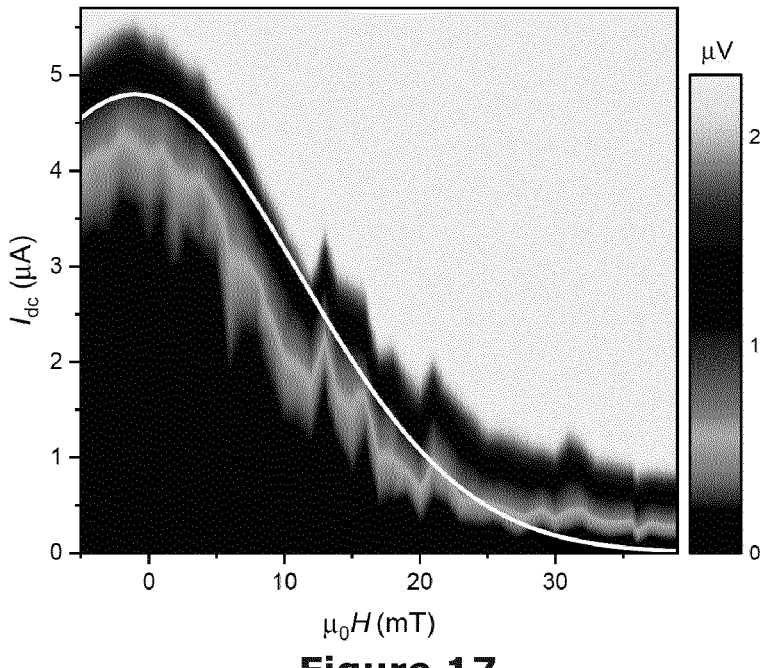

FIG. 16 presents the field-dependent differential resistance (dV/dI) of the Josephson junction JJ3 for positive and negative current bias at T=1.5 K. FIG. 17 presents the field-dependent response of the Josephson junction JJ1 that is shown as I-V measurements taken as a function of magnetic field. In both junctions, the supercurrent amplitude follows a Gaussian-like decay described by Equation (1) with σ=0.4, which is consistent with previously reported values for diffusive Josephson junctions. Due to the different dwell times used for printing the weak links 22 of the Josephson junctions JJ1, JJ3, the weak links 22 of the Josephson junctions JJ1, JJ3 vary in metallicity and therefore exhibit different $I_c(0)$ values. However, since both Josephson junctions JJ1, JJ3 are equivalent in geometry and dimensions, the Josephson junctions JJ1, JJ3 yield a similar field dependence and correspond to the same $I_c(B)/I_c(0)$ pattern. Despite having substantially different zero-field critical currents, the supercurrent transport in both the Josephson junctions JJ1, JJ3 vanishes at around 30 mT. This indicates the ability of the invention to vary the critical current $I_c$ over a wide range independently of the Josephson junction's dimensions.

The Josephson junctions JJ1, JJ3 of the invention have been characterised using low temperature electrical measurements including Shapiro step measurements under external microwave radiation and magnetic field-dependent experiments. It is demonstrated that the critical current $I_c$ of the Josephson junctions can be reliably controlled by the electron beam scanning parameters so as to control the superconducting transport.

The electron beam scanning of the EBID process may be controlled to define the width or thickness of the weak link 22. In addition to the flexibility of the EBID process to produce various dimensions of the weak link 22, the nature of the EBID-formed Josephson junction is such that there is no need for a significant geometrical constriction or tapering of the width and thickness of the weak link 22 relative to the superconducting coherence length of the superconducting electrodes 20 in order to provide a functional Josephson junction. The weak link 22 and the superconducting electrodes 20 may have the same or comparable widths and/or thicknesses that exceed the superconducting coherence length of the superconducting electrodes 20, preferably by one or more orders of magnitude. A width and/or a thickness of the weak link 22 may be larger than a width and/or a thickness of the superconducting electrodes 20. For example, the width and/or thickness of the weak link 22 may be in the range of 5% to 5000% of a width and/or thickness of the superconducting electrodes 20, preferably may correspond to any 10% interval in the range of 5% to 5000% of the width and/or thickness of the superconducting electrodes 20, and more preferably may be in the range of 25% to 4000%, 50% to 3000%, 100% to 2000%, 150% to 1000% or 200% to 500% of the width and/or thickness of the superconducting electrodes 20.

It is envisaged that, in other embodiments of the invention, at least one of a width and a thickness of the weak link 22 may be smaller than the superconducting coherence length of the superconducting electrodes 20.

Figure 18:
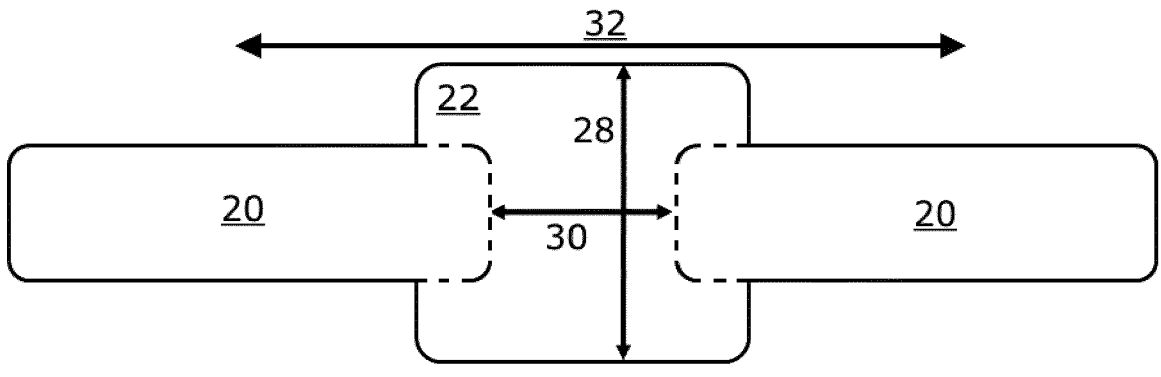
FIGS. 18 to 20 show schematics of EBID-formed Josephson junctions according to embodiments of the invention.
Figure 19:
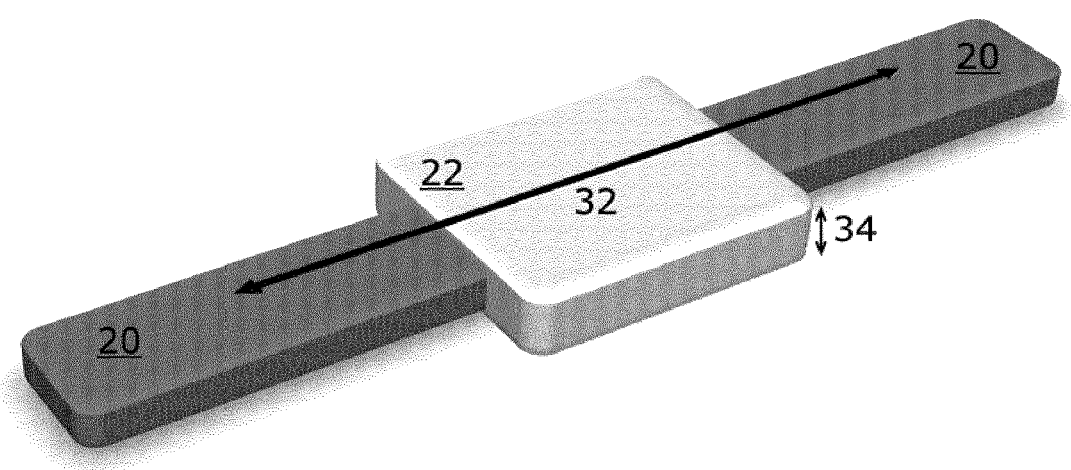

As shown in FIG. 18, the width 28 of the weak link 22 may be measured along an axis that is perpendicular to a dimension 30 of the weak link 22 that separates the superconducting electrodes 20, where the axis is parallel to a direction 32 of electrical transport between the superconducting electrodes 20. As shown in FIG. 19, the thickness 34 of the weak link 22 may be measured along an axis that is perpendicular to a dimension 30 of the weak link 22 that separates the superconducting electrodes 20 and is parallel to a direction 32 of electrical transport between the superconducting electrodes 20.

Figure 20:
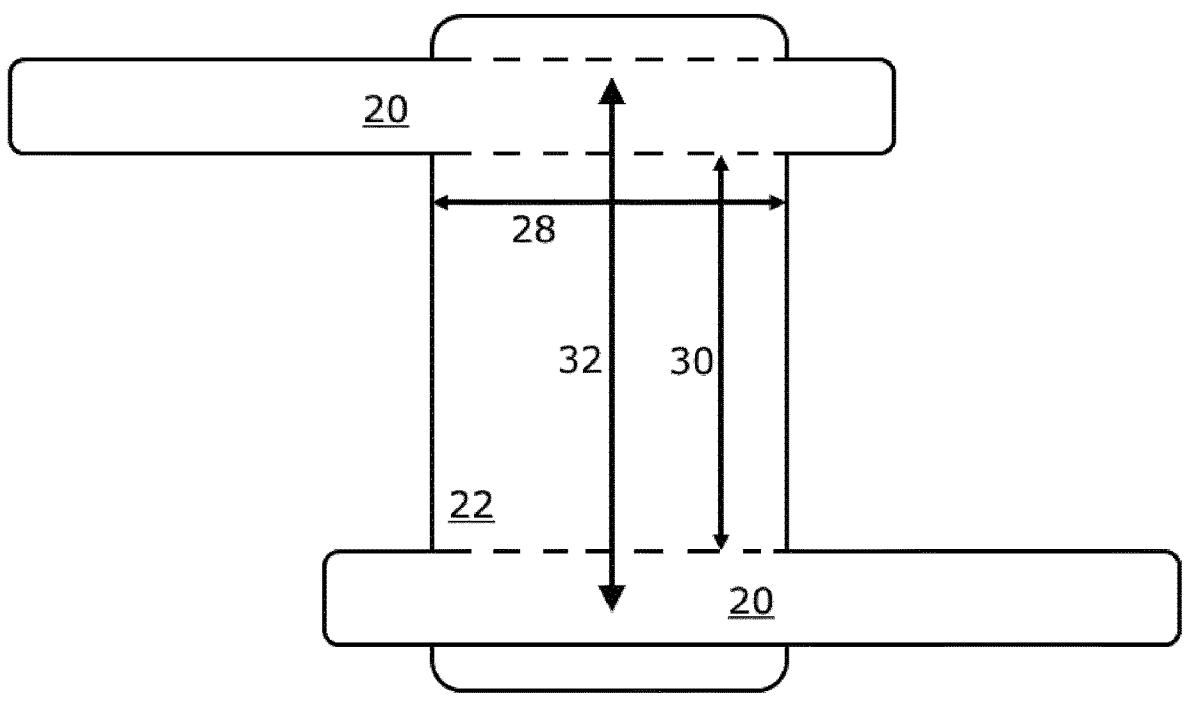

Instead of being coaxial, the superconducting electrodes 20 may be arranged so that their longitudinal axes are offset from each other, as shown in FIG. 20. Similarly, the width 28 of the weak link 22 may be measured along an axis that is perpendicular to a dimension 30 of the weak link 22 that separates the superconducting electrodes 20 and is parallel to a direction 32 of electrical transport between the superconducting electrodes 20.

The provision of the width and/or the thickness of the weak link 22 exceeding the temperature-dependent superconducting coherence length of the superconducting electrodes 20 simplifies, and increases the reliability of, the fabrication of the Josephson junction. This has its advantages when it comes to manufacturing the Josephson junctions in large numbers and/or augmenting or repairing an existing circuit/device.

The direct-write attribute of the EBID process enables the fabrication of a Josephson junction with a substrate-conformal morphology that can be directly formed on a non-planar surface so that at least one of the superconducting electrodes 20 and/or the weak link 22 is non-planar. Furthermore, the direct-write attribute of the EBID process is conducive to the fabrication of a Josephson junction on systems that are mechanically fragile (e.g. membranes, free-standing beams and cantilevers) or are sensitive to chemical processing (e.g. C60 and self-assembly monolayers).

Figure 21:
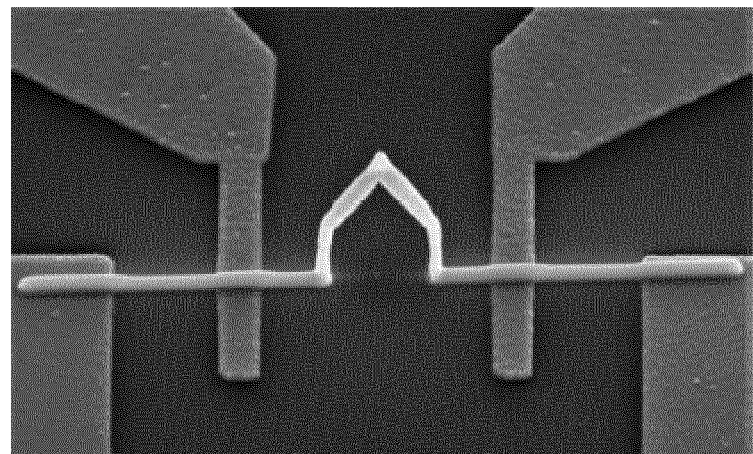
FIG. 21 shows an SEM image of a 3D arch-shaped structure prepared using an EBID process.

The EBID process also enables the fabrication of Josephson junctions for 3D Josephson structures such as 3D superconducting circuits and quantum networks. FIG. 21 shows an SEM image of a 3D arch-shaped structure prepared using an EBID process. The width of the vertical pillars is about 200 nm while the total height of the arch is 4.4 microns. The structure is printed on top of gold electrodes that are used for electrical characterisation. The inventors have obtained metallic behaviour and observed a $T_c$ of up to 4.5 K in the 3D structure of FIG. 21.

A Josephson junction produced by EBID exhibits observable physical characteristics that are distinct from the physical characteristics of a Josephson junction produced using spin coating and dry/wet etching processes. Thin-film structuring processes (e.g. wet or dry etching) result in distinct physical features such as trenches (etching), undercuts (wet-etching) and re-deposition (ion bombardment), which are completely absent in an EBID Josephson junction.

In contrast, the EBID-formed Josephson junction of the invention does not require any post-processing.

A Josephson junction produced by EBID exhibits observable physical characteristics that are distinct from the physical characteristics of a Josephson junction produced by FIB processing. The difference in physical characteristics arises due to the ion bombardment present in FIB processing as opposed to electron bombardment present in EBID. EBID-formed Josephson junctions can be distinguished from those where the weak link is formed by irradiating part of a superconductor with a beam of energetic ions (e.g. gallium ions). Firstly, the use of an ion beam leads to local sputtering and leaves local indentations (e.g. trenches) on the surface. Such features can be readily identified using standard SEM images. Secondly, the use of an ion beam results in a distinct residue of implanted ions that can be easily identified using EDX.

In contrast, EBID is an additive technique and does not utilize the use of energetic ions. Consequently, signs of local sputtering or ion implantation will be entirely absent in, or in the vicinity of, an EBID-formed Josephson junction.

Non-limiting examples of products and applications of the Josephson junction of the invention are discussed throughout this specification.

The listing or discussion of apparently prior-published document or information in this specification should not necessarily be taken as an acknowledgement that the document or information is part of the state of the art or is common general knowledge.

Preferences and options for a given aspect, feature or parameter of the invention should, unless the context indicates otherwise, be regarded as having been disclosed in combination with any and all preferences and options for all other aspects, features and parameters of the invention.

The invention claimed is:

1. A Josephson junction comprising superconducting electrodes interconnected via an intermediate Josephson barrier, wherein the superconducting electrodes and the intermediate Josephson barrier are made out of the same chemical elements and are in a pristine condition, wherein the Josephson junction is a direct-written electron beam induced deposit.

2. The Josephson junction according to claim 1 wherein one or more local material characteristics of the superconducting electrodes are different from one or more local material characteristics of the intermediate Josephson barrier.

3. The Josephson junction according to claim 2 wherein the one or more local material characteristics include at least one of: a ratio between chemical element constituents; morphology; and lattice order.

4. The Josephson junction according to claim 1 wherein the superconducting electrodes and the intermediate Josephson barrier are made out of the same alloy.

5. The Josephson junction according to claim 1 wherein the Josephson junction has a substrate-conformal morphology.

6. The Josephson junction according to claim 1 wherein at least one of the superconducting electrodes and/or the intermediate Josephson barrier is non-planar.

7. The Josephson junction according claim 1 wherein at least one of a width and a thickness of the intermediate Josephson barrier is larger than a temperature-dependent superconducting coherence length of the superconducting electrodes.

8. The Josephson junction according to claim 1 wherein at least one of a width and a thickness of the intermediate Josephson barrier is smaller than a temperature-dependent superconducting coherence length of the superconducting electrodes.

9. The Josephson junction according to claim 1 wherein a width and/or a thickness of the intermediate Josephson barrier is the same as, substantially the same as or larger than a width and/or a thickness of the superconducting electrodes.

10. The Josephson junction according to claim 1 wherein a width and/or a thickness of the intermediate Josephson barrier is in the range of 5% to 5000% of a width and/or a thickness of the superconducting electrodes.

11. A method of fabricating a Josephson junction, the Josephson junction comprising superconducting electrodes interconnected via an intermediate Josephson barrier, the method comprising the step of scanning an electron beam in the presence of a precursor in an electron beam induced deposition process to directly write the Josephson junction, wherein the superconducting electrodes and the intermediate Josephson barrier are made out of the same chemical elements that is deposited from the precursor.

12. The method according to claim 11 including the step of controlling one or more electron beam induced deposition parameters to tune one or more electrical transport properties of the superconducting electrodes and the intermediate Josephson barrier.

13. The method according to claim 12 wherein the one or more electrical transport properties of the superconducting electrodes and the intermediate Josephson barrier include at least one of: superconducting transition temperature; electrical conductivity; and critical current.

14. The method according to claim 12 wherein the one or more electron beam induced deposition parameters include at least one of: scanning speed; scanning step size; dwell time; scanning overlap; beam energy; beam voltage; beam current; beam current density; and beam focus.

15. The method according to claim 12 wherein the step of controlling one or more electron beam induced deposition parameters to tune one or more electrical transport properties of the superconducting electrodes and the intermediate Josephson barrier includes controlling the one or more electron beam induced deposition parameters to vary one or more local material characteristics of the superconducting electrodes and the intermediate Josephson barrier.

16. The method according to claim 15 wherein the one or more local material characteristics include at least one of: a ratio between chemical element constituents; morphology; and lattice order.

17. The method according to claim 11 including the step of fabricating a Josephson junction on a mechanically fragile substrate or a chemically sensitive surface.

18. A superconducting device or electronic circuit comprising at least one Josephson junction according to claim 1.

19. The superconducting device or electronic circuit according to claim 18 wherein the superconducting device or electronic circuit is a superconducting circuit, a superconducting quantum interference device or a three-dimensional superconducting structure.

20. The method of fabricating a superconducting device or electronic circuit, the method comprising the step of fabricating at least one Josephson junction of the superconducting device or electronic circuit according to claim 11.

* * * * *